United States Patent
Black et al.

(10) Patent No.: US 6,881,305 B2
(45) Date of Patent: Apr. 19, 2005

(54) HEATED AND COOLED VACUUM CHAMBER SHIELD

(75) Inventors: Russell Black, Longmont, CO (US); Norman L. Turner, Mountain View, CA (US); Ernest Demaray, Portola Valley, CA (US)

(73) Assignee: Applied Materials, Inc., Santa Clara, CA (US)

( * ) Notice: Subject to any disclaimer, the term of this patent is extended or adjusted under 35 U.S.C. 154(b) by 421 days.

(21) Appl. No.: 10/011,590

(22) Filed: Nov. 6, 2001

(65) Prior Publication Data

US 2002/0108571 A1 Aug. 15, 2002

(Under 37 CFR 1.47)

Related U.S. Application Data

(62) Division of application No. 09/328,503, filed on Jan. 9, 1998, now Pat. No. 6,432,203, which is a continuation of application No. 08/819,599, filed on Mar. 17, 1997, now abandoned.

(51) Int. Cl.[7] .......................... C23C 14/34; F27B 15/00; F25B 29/00
(52) U.S. Cl. .............. 204/192.1; 204/192.12; 204/298.11; 204/298.07; 432/14; 165/58
(58) Field of Search .................. 204/192.1, 192.12, 204/192.13, 298.11, 298.07; 165/58; 432/14

(56) References Cited

U.S. PATENT DOCUMENTS

| 5,336,585 A | 8/1994 | Takahashi et al. ........... 430/284 |
| 5,362,526 A | 11/1994 | Wang et al. ................. 427/573 |
| 5,366,585 A | 11/1994 | Robertson et al. .......... 156/643 |
| 5,449,444 A | 9/1995 | Yoshikawa .............. 204/192.12 |
| 5,487,822 A | 1/1996 | Demaray et al. ....... 204/298.09 |
| 5,518,593 A | 5/1996 | Hosokawa et al. .......... 204/192 |
| 5,728,278 A | 3/1998 | Okamura et al. ....... 204/298.11 |
| 6,083,365 A | 7/2000 | Kitabatake et al. .... 204/298.21 |

FOREIGN PATENT DOCUMENTS

| EP | 0 196 682 A1 | 10/1986 | ........... C30B/25/10 |
| JP | 1-205066 | 8/1989 | ........... C23C/14/22 |

*Primary Examiner*—Steven Versteeg
(74) *Attorney, Agent, or Firm*—Fish & Richardson

(57) ABSTRACT

The invention is directed to an apparatus and method for reducing particulates in a semiconductor processing chamber. The apparatus comprises a shield for lining at portion of the interior of a vacuum processing chamber. The interior of the shield defines a shield passage. A heater element is disposed within the shield passage. A gas inlet is used for providing gases to the interior of the shield passage. The range of temperatures which may be used is wide and generally fitted to the process. For example, the invention may be used to provide a rapid cooldown or bakeout. Once the temperature is chosen, isothermal conditions can be maintained so as to minimize the thermal cycle stress, reducing cracking, peeling, etc.

6 Claims, 4 Drawing Sheets

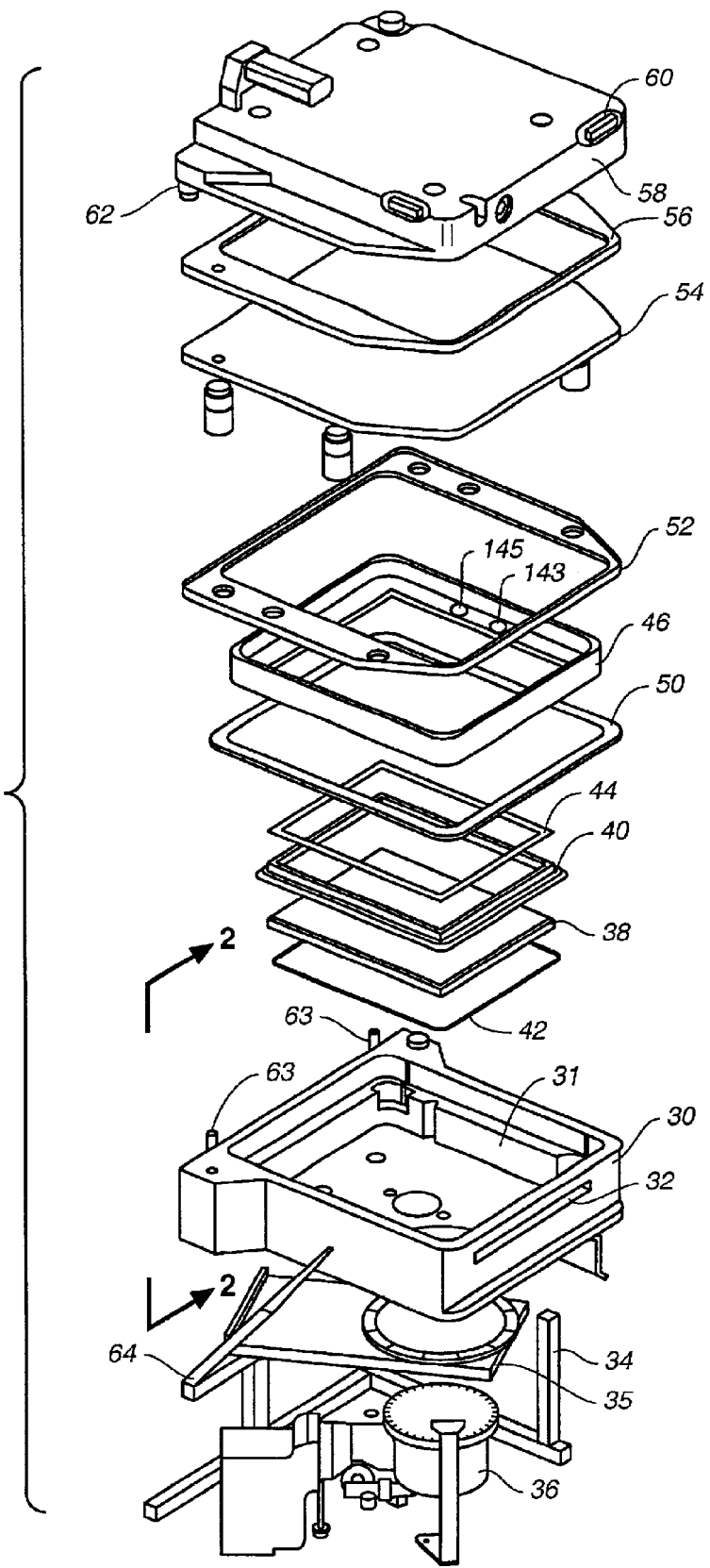
FIG._1

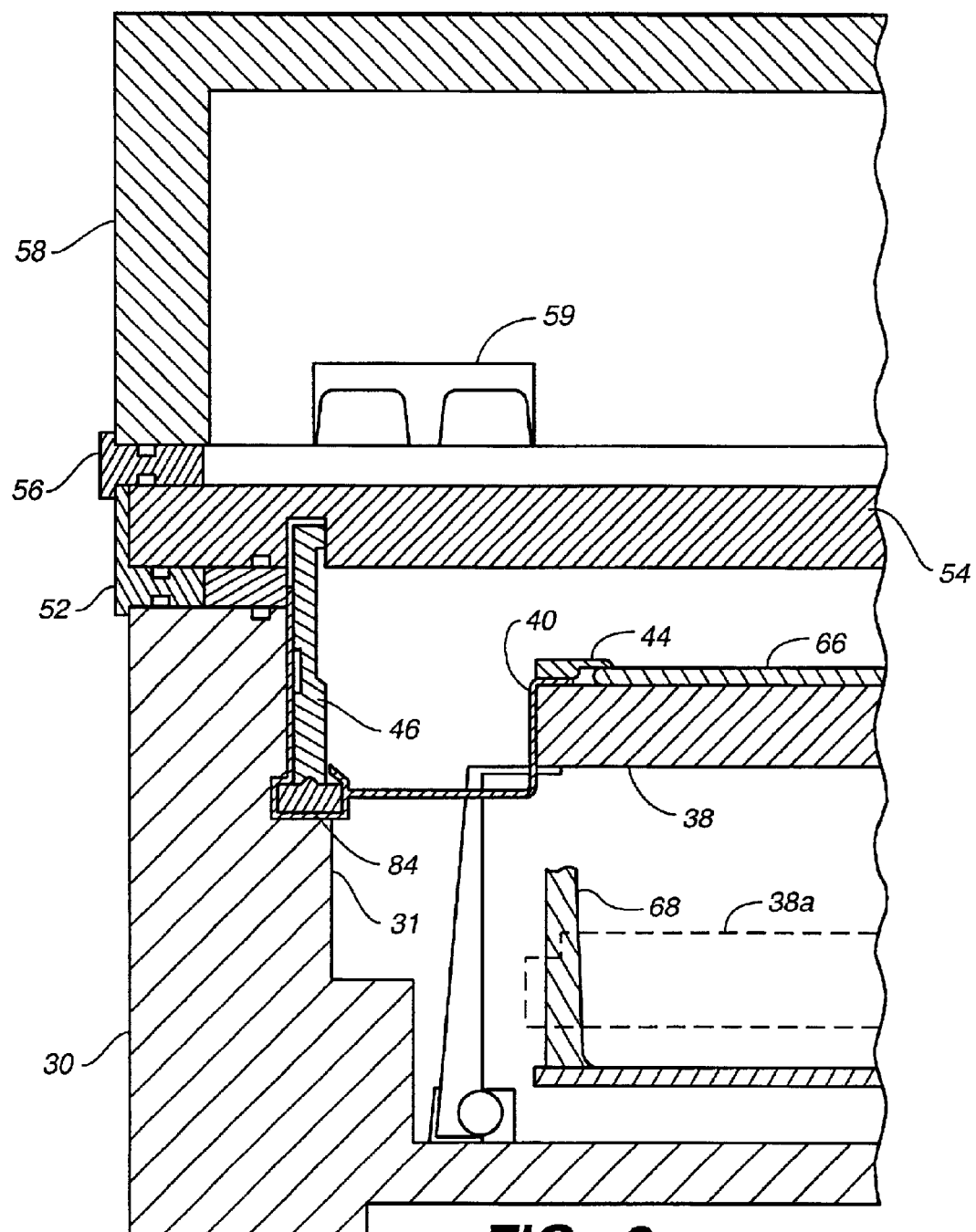
FIG._2

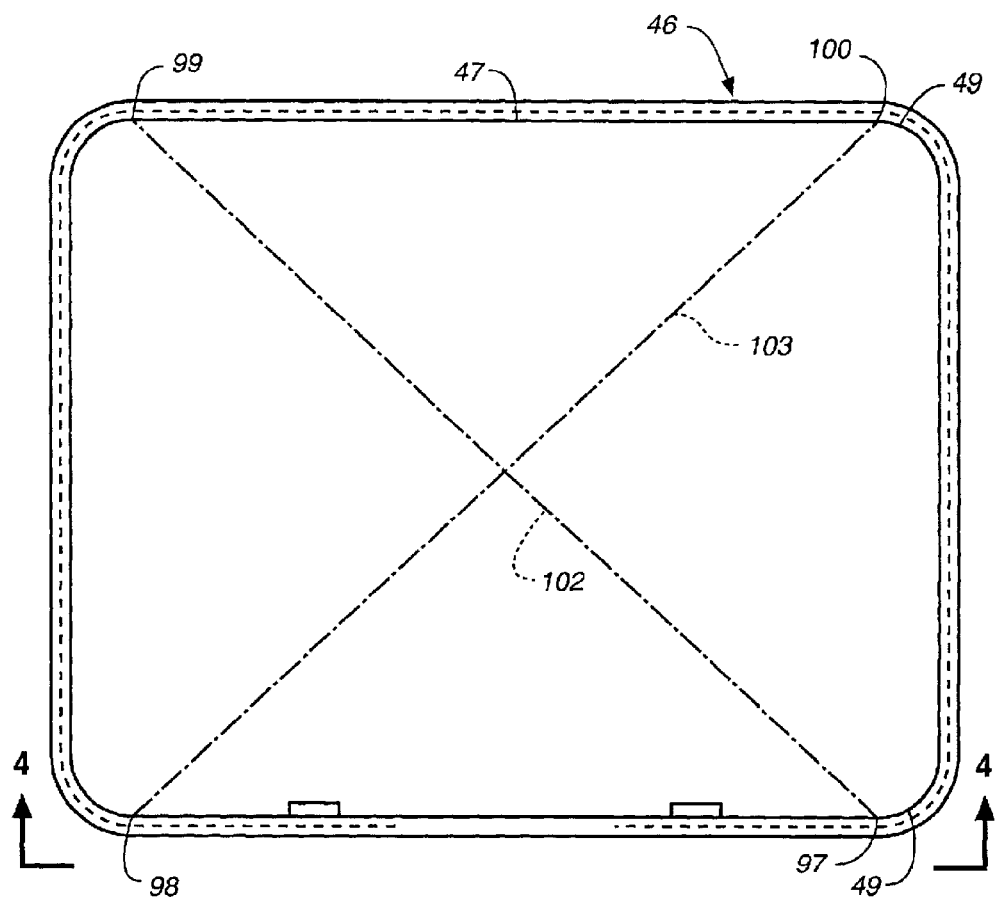
FIG._3
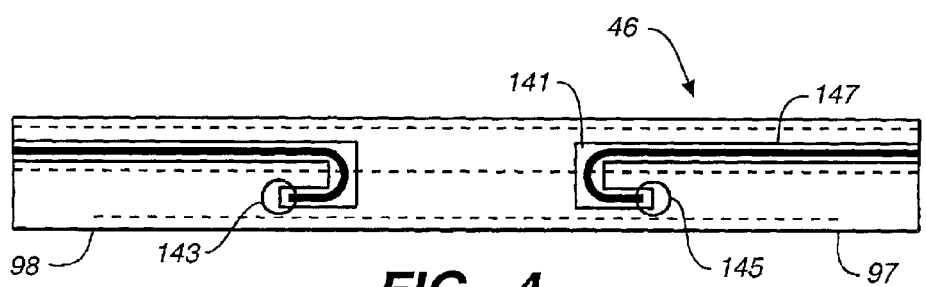
FIG._4

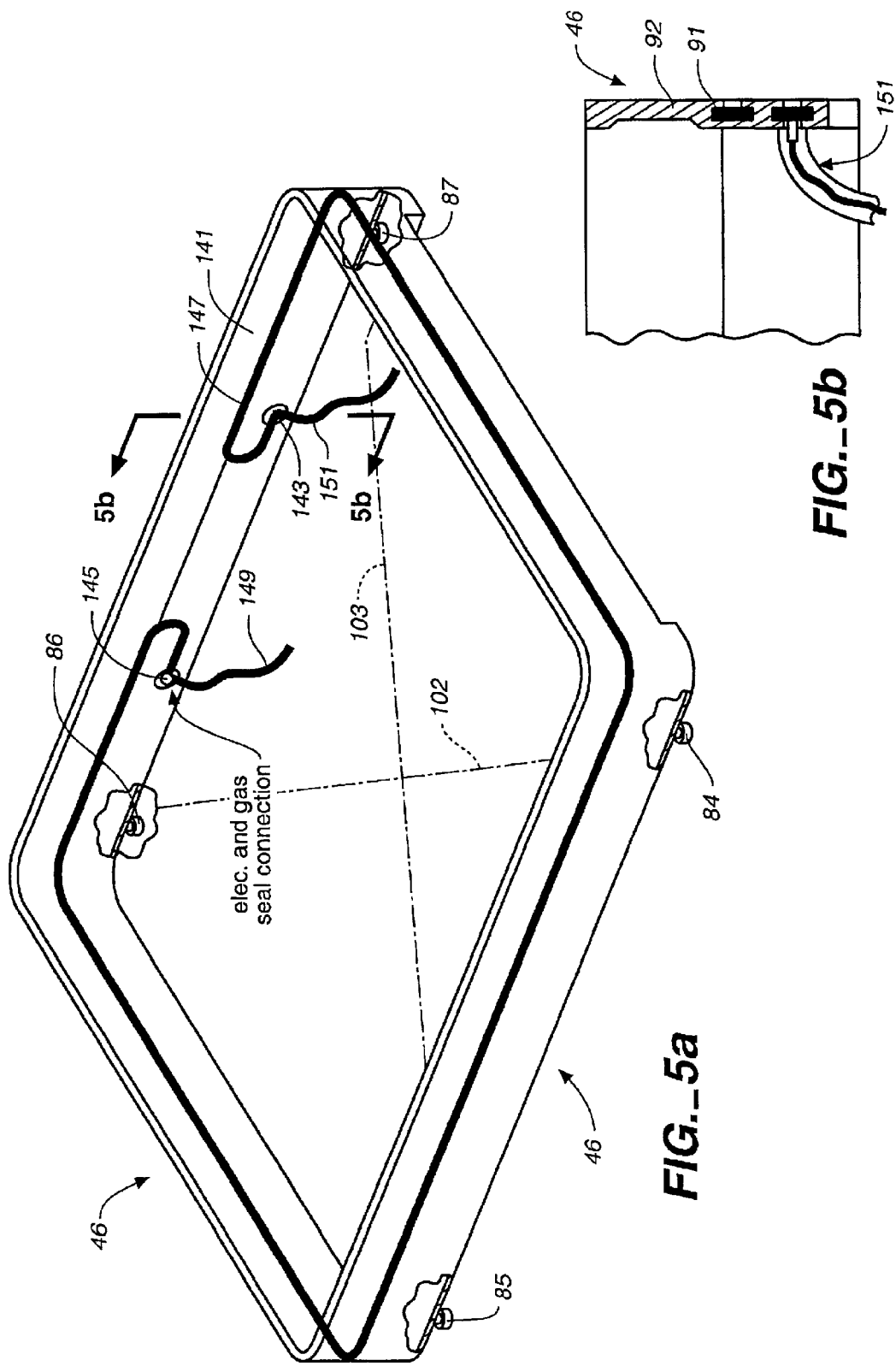

HEATED AND COOLED VACUUM CHAMBER SHIELD

This application is a divisional of application Ser. No. 09/328,503, filed Jan. 9, 1998, now U.S. Pat. No. 6,432,203, issued Aug. 13, 2002, and entitled "Heated and cooled vacuum chamber shield," which is a continuation of application Ser. No. 08/819,599, filed Mar. 17, 1997, now abandoned.

BACKGROUND OF THE INVENTION

The present invention is directed to a method and apparatus for reducing particulates in processing chambers, and more particularly to a method and apparatus for rapidly heating and cooling a vacuum chamber shield.

In substrate processing in general and in physical vapor deposition (PVD) processes such as sputtering in particular, particulates are present and are generated in the processing chamber. These can contaminate and destroy the substrate being processed. When such particulates (also known as "free" particulates) land on the substrate being processed, they can contaminate a small area of the substrate. If the substrate is die cut into separate chips, the contaminated chips can be discarded. However, when a large substrate is intended for subsequent use as a single item, e.g. as a flat panel display, one defect causes the whole unit to be rejected.

The contaminating particulates can originate from several sources. Incomplete or defective chamber cleaning allows particulates to remain in the chamber and cause contamination. Even when the processing chamber is clean, contaminants can be generated during the sputtering process. One type of contaminating particulate originates from sputter deposited material which has deposited itself on processing chamber surfaces other than the substrate intended for deposition. These may subsequentially detach from the location inside the vacuum processing chamber where they originally had been deposited. These particulates are usually cool, multi-molecular sized specks of sputter deposited material which were hot during the sputtering process, but have since cooled as a result of their contact with surrounding surfaces. Such specks can create defects which cause rejection of the substrate.

Another source of particulates is electrical arcing between the highly-negatively charged (biased) target and the surrounding grounded pieces. Arcing occurs in PVD processing chambers at locations between the target and surrounding surfaces, usually a shield enclosing the target. Arcing between adjacent pieces causes a severe localized temperature spike which in most cases releases molecules of one or both of the materials between which the spark arcs. At best, if the released molecules settle on the substrate they create a slight but acceptable anomaly in the coating pattern. At worst, when a particulate is a foreign material, the substrate will be contaminated and will have to be rejected.

In a PVD processing chamber, the target containing the material to be sputtered is generally flat and located parallel to the substrate. Sputtering involves the ionization of gas, e.g. argon (Ar), molecules in the processing chamber. The gas molecules are electrically ionized as a result of an electrical bias, usually a direct current (IC) bias. Once ionized, the positive ions bombard the oppositely-biased target causing the target material to be released into the chamber as molecular size ballistic particles. In the rarified vacuum atmosphere of the vacuum chamber, the target molecules travel nearly unobstructed until they reach the substrate being sputter deposited, which is located just a short distance away.

This sputtering activity coats the substrate as desired by the process, but since the target material being sputtered is emitted in all directions, the surfaces in the processing chamber around the substrate also tend to become coated with sputter-deposited material. These surrounding surfaces are initially generally cold, i.e. at ambient or room temperature. The sputtered material has a very high temperature, usually several thousands of degrees. Upon contact, the sputter-deposited material rapidly cools to the lower temperature of the process chamber surfaces surrounding the substrate. The effect of its condensation on the interior surfaces is to raise the temperature of these interior surfaces to about 180° to 450°.

This may cause some various problems. For example, some of the sputter-deposited material eventually peels off the chamber surface. The tolerances of the components may also be compromised.

To combat these problems, PVD chambers may be constructed with "shield" pieces which act as a lining for the processing chamber. A shadow frame and shield (collectively "shield") line the inside of the processing chamber substantially between the edge of the target being sputtered and the edge of the substrate. The sputter deposited material then coats the inside of the "shield" and not the inside of the chamber wall. The "shield" can then be easily removed and cleaned or replaced which reduces harmful effects on the chamber wall such as occur if continuously exposed to the ionized process gas.

Arcing around the edge of the sputtering target can also create particulates. Arcing is induced when the biased voltage between the target and a nearby grounded (or dissimilarly biased) member is greater than a certain value. This value is a known function of a multiplicative product of the gas pressure and gap spacing between the target and the nearby grounded (or dissimilarly biased) member. The known numerical relationship is given by Paschen's curves (details of which are considered below). The curves show conditions which are conducive to arcing between the target material and the surrounding shield in the "dark space ring" for a particular gas. An arc jumps between the edges of the biased target and grounded pieces such as the "shield." The arc causes specks to erupt from the material. Such specks can contaminate the substrate.

The expansion and contraction of process chamber structures due to changes in their temperature affects the gap or clearance between pieces which in turn affect when arcing might occur. One solution to this arcing problem is to maintain the clearance between adjacent pieces (i.e. the shield and the target) at a relatively constant value to prevent arcing. However, it is difficult to keep a constant clearance between the shield and the target material since the shield expands, and its temperature rises due to exposure to ionized gas particles and sputtered material during the process. It is especially difficult to maintain a desired range of clearance dimensions when sputtering is being done for liquid crystal display (LCD) applications. In these applications, the size of the area being sputtered is relatively large (about 470 mm×370 mm), requiring a long and wide shield (outside dimension, e.g., about 660 mm×570 mm) around the perimeter of the target being sputtered. The larger dimensions create large movements due to differential thermal expansion. Further, a slight misalignment or offset of the shield from the target material during assembly of the processing chamber can create a clearance at one side of the chamber which is conducive to arcing, and thus creates particulates. The thermal cycling of the shield elements, which occurs as sputtering is turned on and off, strains the adhesive bond between the sputter-deposited material and the shield pieces. Weakly bonded specks fall or peel off as a result of the thermal cycling.

Another solution to this problem is equalizing the temperature between the shield and the sputter-deposited material by heating the shield to approximately the temperature of the sputter-deposited material. In this way, there is little or no differential thermal expansion between the sputter-deposited material and the shield surface on which it is deposited.

In this solution, the temperature of the heat shield is controlled by an assembly of radiant heaters which are configured to heat the underside of the shield without affecting the chamber process. Heating the shield causes it to expand. The target material also expands so that the actual change in clearance between the edge of the target and the edge of the shield is minimized.

The target material is usually cooled by a liquid such as water to prevent it from overheating. Even though the sputter-deposited material ejected from the target raises the temperature of the surfaces it contacts to about 180° to 450° C., the whole mass of the target material or a target material and backing plate, in those instances where a backing plate is used, has an average temperature of about 50° to 100° C. In this system, a shield having a chairlike or "h" type-shaped cross section is provided with the front of the chair facing the center of the chamber.

The time required to heat and cool a shield of this configuration is on the order of several hours, with the cooling time longer than the heating time. This is partially due to heat transfer from the heaters to the shield, which in the vacuum environment of a processing chamber is by radiation. This is not very efficient. Even venting the chamber with gas does not produce a cooling time of less than two or three hours. Such venting is also inefficient because it depends on the transmission of thermal energy by conduction to the exterior of the hot surfaces. The slow cooling creates a bottleneck in the chamber opening and closing process which detrimentally affects the time that the chamber is available for substrate processing.

These difficulties need to be overcome in order to increase the yield in production of sputtered substrates and reduce or eliminate substrate rejection because of particulate contamination.

SUMMARY OF THE INVENTION

In one aspect, the invention is directed to an apparatus comprising a shield for lining a portion of the interior of a vacuum processing chamber, the interior of the shield defining a shield passage; a heater element disposed within the shield passage; and a gas inlet for providing gases to the interior of the shield passage.

Implementations of the invention include the following. The shield has a substantially rectangular shape. The heater element is disposed within a channel within the shield passage.

In another aspect, the invention is directed to a processing chamber for processing a substrate comprising a vacuum chamber in which the substrate is supported. The chamber has an inner wall facing a processing region over the substrate. A shield lines the inner wall, the shield disposed adjacent the inner wall, the interior of the shield defining a shield passage in which is disposed a heater element. A gas inlet is used for providing gases to the interior of the shield passage.

In another aspect, the invention is directed to a sputtering process for a substrate in a sputter chamber having a target within a vacuum chamber and a shield covering wall portions of the vacuum chamber between the target and the substrate. The shield defines a shield passage in which is disposed a heater element and which has a gas inlet for providing gases to the interior of the shield passage. The process comprises the steps of sputtering material from the target onto the substrate to form sputter deposited material thereupon. During the sputtering step, the temperature of the shield is controlled to a temperature substantially equal to the temperature of the sputter deposited material by flowing a thermally conductive gas through the gas inlet into the shield passage. The heater element is powered in the presence of the thermally conductive gas.

In another aspect, the invention is directed towards a chamber for processing a rectangular substrate, comprising a vacuum chamber; a generally rectangular pedestal within the chamber for supporting a rectangular substrate; a shield member disposed between the pedestal and a plurality of walls of the vacuum chamber comprising four joined substantially straight sections. The shield defines a shield passage in which is disposed a heater element and has a gas inlet for providing gases to the interior of the shield passage. The heater element may have substantially the same shape as the shield member.

Additional advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

BRIEF DESCRIPTION OF THE DRAWINGS

The accompanying drawings, which are incorporated in and constitute a part of the specification, schematically illustrate the present invention, and together with the general description given above and the detailed description given below, serve to explain the principles of the invention.

FIG. 1 an exploded view of a PVD vacuum processing chamber in which an embodiment according to the present invention may be used.

FIG. 2 is a close-up cross-sectional view of the left side of the processing chamber taken along line 2—2 of FIG. 1.

FIG. 3 is a top-plan view of an embodiment of a shield according to the present invention.

FIG. 4 is a cross-sectional side view of an embodiment of a shield according to the present invention taken along line 4—4 of FIG. 3.

FIG. 5(*a*) is a perspective view of a shield of the present invention, cut away to show a heater strip installed in a shield passage.

FIG. 5(*b*) is a cross-sectional view of a shield of the present invention taken along line 5(*b*)—5(*b*) of FIG. 5(*a*).

DESCRIPTION OF THE PREFERRED EMBODIMENT(S)

FIG. 1 shows an exploded view of the pieces which are generally associated with a PVD sputtering processing chamber. More details are presented in U.S. Pat. Nos. 5,487,822, 5,336,585 and 5,362,526 all of which are owned by the assignee of the present application and are incorporated herein by reference in their entirety.

A processing chamber 30 having an inside processing chamber wall 31 and a slit valve 32 is supported on a frame 34 leading to a gate valve 35 and a cryogenic vacuum pump assembly 36. Processing chamber 30 contains a susceptor or sputtering pedestal 38 supported above a fin plate 42. Sputtering pedestal 38 is surrounded by a sputtering pedestal apron 40. A substrate (not shown in FIG. 1) may be supported on sputtering pedestal 38. A shadow frame 44 covers the edges of the substrate during processing to prevent sputter-deposited material from depositing at the edge and on the back side of the substrate. The substrate is supported on susceptor pedestal 3B faces a target or target assembly 54 which is supported on the top flange of processing chamber 30 by an insulating ring 50 and a lower insulator 52. A shield (or shield assembly) 46 surrounds sputtering pedestal 38 and extends closely adjacent to a target (or target assembly) 54. The top side of target 54 is covered at its perimeter with an upper insulator 56 which supports a top cover 58 which both acts as a cap and houses a magnet drive assembly (not shown).

Top cover 58 often contains a cooling fluid such as water which is piped through the cover to cool the back side of target 54. In other configurations, target 54 is cooled by sending fluid through passages in the target to provide the necessary cooling. Top cover 58 as shown in the present configuration can be lifted by a lift handle 60 to swing on hinge system 62, 63 such that the opening of top cover 58 is assisted by one or more gas-pressurized gate-assisting rams 64 connected between top cover 58 and frame 34 on either or both sides of hinged processing chamber 30.

FIG. 2 shows a cross sectional view of the assembled processing chamber 30 that is shown in FIG. 1 in its unassembled state. As can be seen at the left side of FIG. 2, processing chamber 30 supports insulating ring 50 which is in turn surrounded by lower insulator 52. Insulating ring 50 and lower insulator 52 both support target 54. Target 54 may be solid as shown in FIG. 2 or may have fluid passages for cooling. Target 54, which is electrically biased, is covered and insulated from the outside by lower insulator 52 and upper insulator 56. Top cover 58 creates a chamber into which liquid can be provided to cool the back of target 54 or in which a vacuum can be pulled to equalize the pressure with the process chamber. A linearly scanning magnet carrier 59 is commonly provided in top cover 58 to assist in the sputtering process and reduces the waste caused by uneven erosion of the target material.

A substrate 66 is supported on sputtering pedestal 38. The edges of sputtering pedestal 38 are covered by sputtering pedestal apron 40 while the edges of substrate 66 are covered by shadow frame 44.

A robot paddle (not shown) moves substrate 66 into position in processing chamber 30 through slit valve 32, after sputtering pedestal 38 is lowered to a position shown by its outline in dashed lines 38a. A lifter assembly 68 lifts substrate 66 from the robot paddle and the robot paddle withdraws. Sputtering pedestal 38 then rises to lift substrate 66 and shadow frame 44 to the processing position. Unloading is performed in reverse order.

Pedestal 38, apron 40, and shadow frame 44 of the substrate support assembly (described above) are circumferentially surrounded by a shield 46. Shield 46 acts as a removable lining in the processing chamber between the sputtering target and the substrate being sputtered. Shield 46 is supported from a ledge of processing chamber wall 31 which holds a series of knife edge support cylinders (such as 84).

FIGS. 3, 4, and 5(a)–5(b) show the top, side, and perspective views, respectively, of shield 46. Shield 46 includes shield straight sections 47 and shield corner sections 49. Straight sections 47 and corner sections 49 are welded together using electron beam welding. Shield 46 is generally made of a metal (e.g., 316L stainless steel).

Knife edge support cylinders 84, 85, 86, and 87 loosely fit in matching vertically extending counterbores on the inside of the processing chamber 30. Knife edge receiving grooves 97, 98, 99, and 100 are formed in the short linear portions of shield corner sections 49 and are located on the bottom at the outside edge of shield 46 along the long sides of the shield rectangle adjacent to the actual curve of corner sections 49, but are positioned wholly within shield corner sections 49. The alignment of the ridge (or swale) of the grooves is along center lines 102 and 103 which run approximately 45° (in this example actually 46.5° to be symmetrical and avoid interfering with other items in the processing chamber) from the long side of the rectangle of the shield. The center lines 102 and 103 cross at the rectangular center of the shield which corresponds to the center of processing chamber 30 during substrate processing.

FIG. 4 shows a gas-tight shield passage 141 which is located on the periphery of shield 46. A heater strip 147 can be located within a channel in shield passage 141. A fabrication technique may be to locate heater strip 147 in the channel and to weld the channel shut. Heater strip 147 can be positioned so as to minimize thermal expansion and distortion of shield 46 during heating. This positioning is usually dependant on the precise shape of the shield, and may be calculated using, for example, finite element analysis.

Referring to FIG. 5(a), electrical connections to heater elements in heater strip 147 are provided by conductor leads (not shown) through openings 143 and 145. Hoses 149 and 151 carry gas into and away from shield passage 141. The gas flow is chosen to allow a substantial amount of conduction to occur throughout the shield. These hoses may be routed through the vacuum chamber. The wiring to power heater strip 147 may be located within these hoses.

Seals (not shown) may be provided to attach hoses 149 and 151 to openings 143 and 145. These seals prevent gas from escaping from shield passage 141 to the rest of processing chamber 30. These seals may be, for example, constructed of a metal. Another set of seals may be provided to rout hoses 149 and 151 from the vacuum chamber to gas sources outside of the chamber. Similar seals may also be provided to rout the heater strip connections from shield passage 141 to the outside of the chamber.

During the heating cycle, shield passage 141 is flooded with a thermally-conductive gas so that conductive heat transfer occurs between the surface of heater strip 147 and the internal surfaces of shield passage 141. Typical gases which may be used include air, nitrogen and argon. Generally, the gas used is chosen such that, at the temperature attained by shield passage 141, the gas does not become reactive. Heater strip 147 is configured to provide even heating throughout shield 46. During the cooling cycle, cooled gas can be forced through shield passage 141. Shield passage 141 thus acts as a heat sink or cooling coil, cooling the hot surfaces of shield passage 141 by contacting them with cool gas molecules. The cooled gas is continually replenished to cool shield passage 141 rapidly. Immediate removal of heat can take place, thus promoting highly efficient cooling.

Shield 46 is isolated from the surrounding process chamber walls 31 by the knife edge supports. Because of the minimal surface area and direct contact between the shield and the walls, thermal losses due to conductive heat transfer are minimal. In some instances it may be desired to provide an electrical bias (different from the bias supplied to the target assembly) to shield 46. In this case a set of insulating knife edge supports (e.g. ceramic-alumina) isolate shield 46 from the grounded chamber wall and an electrical bias is provided to shield 46. In other instances when grounding of shield 46 is required, even though a set of conductive metal knife edge support cylinders support shield 46, an extra grounding strap (not shown) is secured between shield 46 and chamber 30 to assure grounding.

Heating the shield also assists in maintaining the clearance between the top edge of shield 46 and the area around target 54 to prevent arcing between target 54 and shield 46 which could generate undesirable particulates. In particular, the thermal expansion of shield 46 may tend to increase the clearance between shield 46 and target 54.

Shield 46 can be maintained at different temperatures for different materials being sputtered. This may be done for purposes of assisting various growth processes.

As an example of growth process where the shield would be heated, silicon may be sputtered to produce a polysilicon layer on a substrate. Such a process may be performed at high temperatures to enhance crystallinity, but at otherwise low growth rates and plasma powers. In this example, the susceptor (and substrate) temperature may be about 400° C. and the temperature of the shield may be in the range of about 425° C. to about 450° C. The plasma power may be in the range of about 500 watts to 1 kilowatt. At 1 kilowatt, a growth rate of a few hundreds of angstroms per minute may be attained. Under these conditions and the above shield heating, good temperature uniformity has been attained.

In a contrasting example of a growth process where the shield would be cooled, aluminum alloys may be deposited on a substrate. Such processes may be performed at low temperatures so that the aluminum alloy does not precipitate out of solution. That is, a low temperature maintains the amorphous solution of the aluminum alloy. The low temperature may be maintained by providing water cooling, although other liquids or gases could be used, such as heat transfer oil, air, dry nitrogen, etc. The shield temperature in this case may be approximately 110° C. In this case, a high power and high growth rate may be used. For example, the power may be up to or even greater than 20 kilowatts, while the growth rate may be up to 1 micron per _minute or even higher. Again, a high quality film may be grown, in this case without the film's constituents precipitating out of solution. In this case, the film growth cycle may be initiated with a rapid cycling of the shield temperature to a high temperature, in order to evaporate contaminants which may have been absorbed on its surface.

A bakeout procedure may also be performed with the heated shield. For example, the shield may be heated to a temperature of about 450° C. to about 500° C. A gas flow of, e.g., argon may be started to create a pressure of, e.g., one-half Torr. Infrared lamps or other heating devices may be used to raise the temperature of the shield even higher if necessary. Such a procedure accomplishes a number of objectives. First, it evaporatively cleans any organic particulates which may have absorbed on the surface of the shield. Second, it outgasses any water vapor, air, or oxygen which may have absorbed on the surface of the shield. Third, it activates the metal surface to enhance the adhesion of the overcoat. For example, after a bakeout procedure, it is important that the first coating of deposited material on the shield adhere well—otherwise, flaking of large pieces of depositants will undesiredly occur in later processes. The heating of the shield helps to accomplish this surface activation.

Typical shield temperatures for target materials are as follows: Aluminum (Al), about 350° C.; ITO, about 330° C.; Tantalum (Ta), about 300° C. These temperatures should be maintained with reasonable accuracy (such as within about ±15° C.). The shield temperature can be adjusted via heating and cooling and typically would be adjusted to a range appropriate for the deposition process. Any of the above materials can be caused to have a temperature anywhere from ambient to about 450°–500°. The shield temperature is generally adjusted according to the process for the material.

The temperature of shield 46 can be increased and controlled by varying and controlling the temperature of heater strip 147 so that the temperature of the outside surface of shield 46 closely approximates the temperature of the sputter-deposited material. The thermally conductive gas within shield passage 141 allows rapid heat transfer from heater strip 147 to the rest of shield 46. Under these conditions, when sputter-deposited material arrives on the outside of shield 46 very little, if any, temperature difference exists between the sputter-deposited material and shield 46. When they are both cooled to ambient temperatures, the interfacial stress due to differential thermal expansion is negligible. Thermal cycling, which might contribute to releasing or peeling of sputter-deposited material, is avoided by using heater strip 147 to maintain the temperature of shield 46 at its normal operating temperatures. This can be in the range of approximately ambient to 500° C. During sputtering, heater strip 147 may provide only a small energy input as there is often a large thermal energy input from the process. Between sputtering events, heater strip 147 may provide a larger energy input so as to maintain the shield temperature at about ambient to 500° C. while the processed substrate is removed and a new substrate is brought into position for processing.

The top surfaces and selected bottom surfaces of shield 46 may be polished to a high gloss of at least about 20 Ra to minimize the surface adhesion of water molecules to rough surfaces which prevent a high vacuum from being reached in a short time when exposed to a high vacuum pumping system. The smooth surface reduces the molecular force of adhesion and reduces the time needed to pump down when compared to the time needed to pump down similar surfaces which are rough or unpolished.

Referring to FIG. 5(*b*), the surfaces of shield 46 are treated so that the outside surface 92 of shield 46 has a low emissivity (e.g. it is polished) while its inside surfaces 91 have a high emissivity to better absorb the radiant heat received from heater strip 147. This difference in surface emissivities reduces the energy needed to heat shield 46 to process temperature and also even further reduces the time needed to heat shield 46 to a predetermined bake-out temperature (such as about 450° C.).

The embodiments of the structure of the invention as discussed above are used to carry out methods of rapidly cycling the temperature of a shield 46 in a processing chamber 30.

A method includes the steps of, while sputtering material from a target 54 onto a substrate 66, determining the temperature of the material being sputter deposited on shield 46, and heating shield 46 which is lining the processing chamber 30 to approximately the temperature of the material being sputter.

Shield 46 is heated by heating heater strip 147 within gas-tight shield passage 141. A thermally-conductive gas is flowed through the gas-tight shield passage 141 to promote heat transfer between the heater strip 147 and the interior walls of shield passage 141.

Cleaning of the shields may also occur via a bakeout procedure where the shields are heated to a high temperature to evaporate the organic or water-containing residues that typically remain after cleaning procedures. By evaporating these materials, the initial sputtered material can have a very high adhesion. The resulting fracture strength may then be quite high.

The present invention has been described in terms of a preferred embodiment. The invention, however, is not limited to the embodiment depicted and described. Rather, the scope of the invention is defined by the appended claims.

What is claimed is:

1. A sputtering process for a substrate in a chamber having a target within a vacuum chamber end a shield covering a wall portion of said vacuum chamber between said target and said substrate, said process comprising the steps of:

providing said shield such that said shield defines an enclosed shield passage in which is disposed a heater element and such that said shield has a gas inlet for providing gases to the interior of the enclosed shield passage, sputtering material from said target onto said substrate to form sputter-deposited material thereupon, and during the sputtering step, controlling the temperature of said shield to a predetermined temperature by flowing a thermally conductive gas through the gas inlet into the enclosed shield passage in the shield and powering said heater element in the presence of said thermally conductive gas.

2. The method of claim 1 wherein the enclosed shield passage includes a gas-tight passage, and wherein:

flowing a thermally conductive gas into the enclosed shield passage includes flowing the thermally conductive gas into the gas-tight passage.

3. A method of processing a substrate in a process chamber having a shield lining at least a portion of an interior wall of the chamber, comprising:

flowing a thermally-conductive fluid through an inlet and into an enclosed passageway inside the shield; and controlling the temperature of the fluid within the enclosed passageway by operation of a heater element which is disposed in the enclosed passageway to provide a selected temperature at an outside surface of the shield.

4. The method of claim 3 wherein the fluid is used to heat the shield.

5. The method of claim 3 wherein the fluid is used to cool the shield.

6. The method of claim 3, wherein the enclosed passageway includes a gas-tight passageway, and wherein:

flowing the thermally-conductive fluid into the enclosed passageway includes flowing the thermally-conductive fluid into the gas-tight passageway.

* * * * *

UNITED STATES PATENT AND TRADEMARK OFFICE
CERTIFICATE OF CORRECTION

PATENT NO. : 6,881,305 B2 Page 1 of 1
APPLICATION NO. : 10/011590
DATED : April 19, 2005
INVENTOR(S) : Russell Black, Norman L. Turner and Ernest Demaray It is certified that error appears in the above-identified patent and that said Letters Patent is hereby corrected as shown below:

On the Cover of the Patent

Item [57], Abstract, Line 3: After "lining", change "at" to --a--

Column 1, Line 62: Change "(IC)" to --(DC)--

Column 5, Line 9: After "substrate", delete "is"

Column 5, Line 10: Change "3B" to --38--

Column 7, Line 47: Delete the "_" before "minute"

Column 9, Line 1: Delete the "_" before "within"

In the Claims

Column 9, Claim 1, Line 19: Change "end" to --and--

Signed and Sealed this

Twelfth Day of September, 2006

JON W. DUDAS
*Director of the United States Patent and Trademark Office*